(12) United States Patent
Park et al.

(10) Patent No.: US 11,133,080 B2
(45) Date of Patent: Sep. 28, 2021

(54) MEMORY DEVICE AND TEST OPERATION METHOD THEREOF

(71) Applicant: SK hynix Inc., Icheon-si (KR)

(72) Inventors: Chang Kyun Park, Yongin-si (KR); Young Sik Koh, Suwon-si (KR); Seung Jin Park, Suwon-si (KR); Dong Hyun Lee, Seoul (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/727,282

(22) Filed: Dec. 26, 2019

(65) Prior Publication Data

US 2020/0381070 A1    Dec. 3, 2020

(30) Foreign Application Priority Data

May 30, 2019    (KR) .......... 10-2019-0064089

(51) Int. Cl.
  *G11C 29/12*    (2006.01)
  *G11C 29/18*    (2006.01)
  *G11C 29/44*    (2006.01)

(52) U.S. Cl.
  CPC .......... *G11C 29/1201* (2013.01); *G11C 29/18* (2013.01); *G11C 29/44* (2013.01); *G11C 2029/1206* (2013.01)

(58) Field of Classification Search
  CPC .................................................. G11C 29/201
  See application file for complete search history.

(56) References Cited

U.S. PATENT DOCUMENTS

| | | |
|---|---|---|
| 6,738,880 B2 | 5/2004 | Lai et al. |
| 6,813,682 B2 | 11/2004 | Bress et al. |
| 7,339,838 B2 | 3/2008 | LaBerge |
| 7,399,838 B2 | 7/2008 | Reiter |
| 7,500,075 B1 | 3/2009 | Garrett, Jr. |
| 8,364,881 B2 | 1/2013 | Urabe |
| 9,025,384 B2 | 5/2015 | Lee et al. |
| 9,037,774 B2 | 5/2015 | Solomon et al. |
| 9,093,132 B2 | 7/2015 | Kim et al. |
| 9,536,590 B1 | 1/2017 | Zhu et al. |
| 10,002,652 B1 | 6/2018 | Seong et al. |
| 10,073,643 B2 | 9/2018 | Jung et al. |

(Continued)

FOREIGN PATENT DOCUMENTS

| | | |
|---|---|---|
| KR | 10-2010-0099892 A | 9/2010 |
| KR | 10-2014-0088730 A | 7/2014 |

(Continued)

OTHER PUBLICATIONS

KIM,H.J. et al., IGB/s 2Tb NAND Flash Multi-Chip Package with Frequency-Boosting Interface Chip, ISSCC 2015 Session 7.*

(Continued)

*Primary Examiner* — Muna A Techane

(57) ABSTRACT

The present technology includes a memory device and a method of operating the same. The memory device in which an interface circuit and a semiconductor memory are packaged together includes a centrally located region in a ball mapping region of a memory device in which data input/output pins for an operation of the interface circuit and the semiconductor memory are disposed, and a test pin region in which test pins for a test operation of the interface circuit are disposed.

17 Claims, 13 Drawing Sheets

(56) References Cited

U.S. PATENT DOCUMENTS

| | | |
|---|---|---|
| 10,229,743 B1 | 3/2019 | Han |
| 10,430,361 B1 | 10/2019 | Wiebe et al. |
| 10,496,332 B2 | 12/2019 | Srivastava et al. |
| 10,714,162 B2 | 7/2020 | Koh |
| 10,747,463 B2 | 8/2020 | Kajigaya |
| 2002/0040418 A1 | 4/2002 | Bress et al. |
| 2002/0069381 A1* | 6/2002 | Jeong .................. G11C 29/44 714/704 |
| 2004/0186953 A1 | 9/2004 | Bress et al. |
| 2004/0193834 A1 | 9/2004 | Emberling |
| 2006/0053353 A1* | 3/2006 | Youn .................. G11C 29/1201 714/718 |
| 2007/0206400 A1 | 9/2007 | Bress et al. |
| 2008/0030221 A1 | 2/2008 | Lee et al. |
| 2008/0080226 A1 | 4/2008 | Mikolajick et al. |
| 2008/0123217 A1 | 5/2008 | Ishii |
| 2009/0016124 A1 | 1/2009 | Kim |
| 2009/0080374 A1 | 3/2009 | Lee et al. |
| 2009/0249136 A1* | 10/2009 | Halstvedt .................. G11C 29/48 714/718 |
| 2010/0008177 A1 | 1/2010 | Joo et al. |
| 2010/0054059 A1 | 3/2010 | Yoon et al. |
| 2010/0054073 A1 | 3/2010 | Park |
| 2010/0161933 A1 | 6/2010 | Moon et al. |
| 2011/0050295 A1 | 3/2011 | Kim et al. |
| 2011/0218949 A1 | 9/2011 | Cho et al. |
| 2011/0296068 A1 | 12/2011 | Fredenberg et al. |
| 2011/0296124 A1 | 12/2011 | Fredenberg et al. |
| 2012/0106278 A1 | 5/2012 | Na |
| 2012/0272112 A1* | 10/2012 | Oh .................. G01R 31/318555 714/727 |
| 2013/0272073 A1 | 10/2013 | Hendrickson |
| 2014/0181452 A1 | 6/2014 | Malladi et al. |
| 2015/0170724 A1 | 6/2015 | Shaeffer et al. |
| 2015/0214172 A1* | 7/2015 | Lin .................. H01L 23/50 257/738 |
| 2016/0062690 A1 | 3/2016 | Shin et al. |
| 2016/0180898 A1 | 6/2016 | Hwang et al. |
| 2016/0180914 A1 | 6/2016 | Kong |
| 2018/0004688 A1 | 1/2018 | Chung et al. |
| 2018/0233184 A1* | 8/2018 | Choi .................. H03K 3/00 |
| 2018/0373313 A1 | 12/2018 | Hasbun |
| 2019/0004984 A1 | 1/2019 | Lee et al. |
| 2019/0034365 A1 | 1/2019 | Lovelace et al. |
| 2019/0038151 A1 | 2/2019 | Lee et al. |
| 2019/0042120 A1 | 2/2019 | Kajigaya |
| 2019/0079699 A1 | 3/2019 | Lee et al. |
| 2019/0095223 A1 | 3/2019 | Dubel et al. |
| 2019/0156247 A1 | 3/2019 | Faulhaber, Jr. et al. |
| 2019/0130950 A1 | 5/2019 | Kim et al. |
| 2019/0212769 A1 | 7/2019 | Carlough et al. |
| 2019/0280600 A1 | 9/2019 | Rowley |
| 2019/0295658 A1 | 9/2019 | Amaki et al. |
| 2019/0296723 A1 | 9/2019 | Tang et al. |
| 2019/0303310 A1* | 10/2019 | Richter .................. G06F 3/061 |
| 2019/0310784 A1 | 10/2019 | Kim et al. |
| 2019/0317683 A1 | 10/2019 | Mayer et al. |
| 2019/0318555 A1 | 10/2019 | Hansel et al. |
| 2019/0339881 A1 | 11/2019 | Scott, III |
| 2019/0348095 A1 | 11/2019 | Koh |
| 2019/0355435 A1 | 11/2019 | Liikanen et al. |
| 2019/0362763 A1 | 11/2019 | Lee et al. |
| 2019/0392891 A1 | 12/2019 | Hong |
| 2020/0133505 A1 | 4/2020 | Kim |
| 2020/0133540 A1 | 4/2020 | Pilolli et al. |
| 2020/0133542 A1 | 4/2020 | Kim et al. |
| 2020/0160902 A1 | 5/2020 | Gans |
| 2020/0192791 A1 | 6/2020 | Yang et al. |
| 2020/0211640 A1 | 7/2020 | Sharon et al. |
| 2020/0241984 A1 | 7/2020 | Shim et al. |
| 2020/0264884 A1 | 8/2020 | Jung |
| 2020/0265876 A1 | 8/2020 | Takefman et al. |
| 2020/0372940 A1 | 11/2020 | Park et al. |
| 2020/0372941 A1 | 11/2020 | Park et al. |

FOREIGN PATENT DOCUMENTS

| | | |
|---|---|---|
| KR | 10-2015-0143943 A | 12/2015 |
| KR | 10-2016-0041717 A | 4/2016 |
| KR | 10-2018-0006654 A | 1/2018 |

OTHER PUBLICATIONS

Office Action issued by the USPTO dated Oct. 19, 2020 with respect to the U.S. Appl. No. 16/679,561, filed Nov. 11, 2019.

Office Action issued by the USPTO dated Sep. 3, 2020 with respect to the U.S. Appl. No. 16/679,582, filed Nov. 11, 2019.

Office Action issued by the USPTO dated Nov. 26, 2019 with respect to the U.S. Appl. No. 16/215,981, filed Dec. 11, 2018.

Office Action issued by the USPTO dated Jul. 9, 2020 with respect to the U.S. Appl. No. 16/895,050, filed Jun. 8, 2020.

KIM,H.J. et al., 1GB/s 2Tb NAND Flash Multi-Chip Package with Frequency-Boosting Interface Chip, ISSCC 2015 Session 7.

Non-Final Rejection of U.S. Appl. No. 16/679,601, dated Mar. 4, 2021.

Notice of Allowance of U.S. Appl. No. 16/679,561, dated Feb. 23, 2021.

* cited by examiner

FIG. 7

|   | 1  | 2  | 3     | 4     | 5      | 6     | 8      | 9      | 10     | 11     | 12 | 13 |
|---|----|----|-------|-------|--------|-------|--------|--------|--------|--------|----|----|
| A | NC | NC | NC    | NC    |        |       |        |        | NC     | NC     | NC | NC |
| B | NC | NC | NC    | NC    |        |       |        |        | NC     | NC     | NC | NC |
| C | NC | NC | NC    | NC    |        |       |        |        | NC     | NC     | NC | NC |
| D | NC | NC | VCCQ  | VCCQ  | DQ3_1  | VSS   | VCC    | DQ4_1  | VCCQ   | VCCQ   | NC | NC |
| E | NC | NC | VSS   | DQ2_1 | VSS    | DQS_1_T | RE_1_T | VSS  | DQ5_1  | VSS    | NC | NC |
| F |    |    | DQ0_1 | DQ1_1 | DQS_1_C | DQ2_1 | WE_1_N | VREF_1 | DQ6_1 | DQ7_1  |    |    |
| G |    |    | VSS   | VCCQ  | ALE_1  | CLE_1 | CE3_1_N | CE2_1_N | VCCQ | VSS    |    |    |
| H |    |    | Eno   | ENi   | WP_1_N | NC    | CE1_1_N | CE0_1_N | ZQ_1_N | NC    |    |    |
| J |    |    | VSS   | VCC   | R/B_0_N | R/B_2_N | R/B_3_N | R/B_1_N | VCC | VSS    |    |    |
| K |    |    | NC    | ZQ_0_N | CE0_0_N | CE1_0_N | VPP  | WP_0_N | NC     | NC     |    |    |
| L |    |    | VSS   | VCCQ  | CE2_0_N | CE3_0_N | CLE_0 | ALE_0 | VCCQ   | VSS    |    |    |
| M |    |    | DQ7_0 | DQ6_0 | VREF_0 | WE_0_N | RE_0_C | DQS_0_C | DQ1_0 | DQ0_0 |    |    |
| N | NC | NC | VSS   | DQ5_0 | VSS    | RE_0_T | DQS_0_T | VSS  | DQ2_0  | VSS    | NC | NC |
| P | NC | NC | VCCQ  | VCCQ  | DQ4_0  | VCC   | VSS    | DQ3_0  | VCCQ   | VCCQ   | NC | NC |
| R | NC | NC | NC    | NC    |        |       |        |        | NC     | NC     | NC | NC |
| T | NC | NC | NC    | NC    |        |       |        |        | NC     | NC     | NC | NC |
| U | NC | NC | NC    | NC    |        |       |        |        | NC     | NC     | NC | NC |

FIG. 8

EDGE_A, Interface_test_PIN_B, NAND_PKG_BALL, Interface_test_PIN_A, EDGE_B

| | 1 | 2 | 3 | 4 | 5 | 6 | 8 | 9 | 10 | 11 | 12 | 13 |
|---|---|---|---|---|---|---|---|---|---|---|---|---|
| A | NC | NC | NC | NC | | | | | NC | NC | NC | NC |
| B | NC | NC | NC | NC | | | | | NC | NC | NC | NC |
| C | NC | NC | NC | NC | | | | | NC | NC | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F | | | DQ0_1 | DQ1_1 | DQS_1_C | DQ2_1 | WE_1_N | VREF_1 | DQ6_1 | DQ7_1 | | |
| G | VQPS_1 | | VSS | VCCQ | ALE_1 | CLE_1 | CE3_1_N | CE2_1_N | VCCQ | VSS | | NC |
| H | ANA_ITO_1 | | Eno | ENi | WP_1_N | NC | CE1_1_N | CE0_1_N | ZQ_1_N | NC | | VDD_CORE_0 |
| J | VDDI_1 | | VSS | VCC | R/B_0_N | R/B_2_N | R/B_3_N | R/B_1_N | VCC | VSS | | VDDI_0 |
| K | VDD_CORE_1 | | NC | ZQ_0_N | CE0_0_N | CE1_0_N | VPP | WP_0_N | NC | NC | | ANA_ITO_0 |
| L | NC | | VSS | VCCQ | CE2_0_N | CE3_0_N | CLE_0 | ALE_0 | VCCQ | VSS | | VQPS_0 |
| M | | | DQ7_0 | DQ6_0 | VREF_0 | WE_0_N | RE_0_C | DQS_0_C | DQ1_0 | DQ0_0 | | |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | NC | NC | | | | | NC | NC | NC | NC |
| T | NC | NC | NC | NC | | | | | NC | NC | NC | NC |
| U | NC | NC | NC | NC | | | | | NC | NC | NC | NC |

EDGE_C, EDGE_D

FIG. 11

| | 1 | 2 | 3 | 4 | 5 | 6 | 8 | 9 | 10 | 11 | 12 | 13 |
|---|---|---|---|---|---|---|---|---|---|---|---|---|
| A | NC | NC | NC | NC | | | | | NC | NC | NC | NC |
| B | NC | NC | NC | NC | | | | | NC | NC | NC | NC |
| C | NC | NC | NC | CE_MUX | | | | | CE4_1_N | CE6_1_N | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F | | | DQ0_1 | DQ1_1 | DQS_1_C | DQ2_1 | WE_1_N | VREF_1 | DQ6_1 | DQ7_1 | | |
| G | VQPS_1 | | VSS | VCCQ | ALE_1 | CLE_1 | CE3_1_N | CE2_1_N | VCCQ | VSS | | NC |
| H | ANA_ITO_1 | | Eno | ENi | WP_1_N | CE5_0_N | CE1_1_N | CE0_1_N | ZQ_1_N | CE7_1_N | | VDD_CORE_0 |
| J | VDDI_1 | | VSS | VCC | R/B_0_N | R/B_2_N | R/B_3_N | R/B_1_N | VCC | VSS | | VDDI_0 |
| K | VDD_CORE_1 | CE7_0_N | ZQ_0_N | CE0_0_N | CE1_0_N | | VPP | WP_0_N | NC | CE5_1_N | | ANA_ITO_0 |
| L | NC | | VSS | VCCQ | CE2_0_N | CE3_0_N | CLE_0 | ALE_0 | VCCQ | VSS | | VQPS_0 |
| M | | | DQ7_0 | DQ6_0 | VREF_0 | WE_0_N | RE_0_C | DQS_0_C | DQ1_0 | DQ0_0 | | |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | CE6_0_N | CE4_0_N | | | | | NC | NC | NC | NC |
| T | NC | NC | NC | NC | | | | | NC | NC | NC | NC |
| U | NC | NC | NC | NC | | | | | NC | NC | NC | NC |

EDGE_A, Interface_test_PIN_B, TEST_PIN, NAND_PKG_BALL, TEST_PIN, Interface_test_PIN_A, EDGE_B

EDGE_C, TEST_PIN, TEST_PIN, EDGE_D

FIG. 12

Callouts: EDGE_A, Interface_test_PIN_B, NAND_test_PIN_A, TEST_PIN, NAND_PKG_BALL, TEST_PIN, Interface_test_PIN_A, EDGE_B, TEST_PIN (bottom), NAND_test_PIN_B, TEST_PIN, EDGE_C, EDGE_D

| | 1 | 2 | 3 | 4 | 5 | 6 | 8 | 9 | 10 | 11 | 12 | 13 |
|---|---|---|---|---|---|---|---|---|---|---|---|---|
| A | NC | NC | NC | NC | | | | | NC | NC | NC | NC |
| B | NC | NC | NC | NC | VQPS_1 | ANA_IT0_1 | VDDI_1 | VDD_CORE_1 | NC | NC | NC | NC |
| C | NC | NC | NC | CE_MUX | | | | | CE4_1_N | CE6_1_N | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F | | | DQ0_1 | DQ1_1 | DQS_1_C | DQ2_1 | WE_1_N | VREF_1 | DQ6_1 | DQ7_1 | | |
| G | VQPS_1 | | VSS | VCCQ | ALE_1 | CLE_1 | CE3_1_N | CE2_1_N | VCCQ | VSS | | NC |
| H | ANA_IT0_1 | | Eno | ENi | WP_1_N | CE5_0_N | CE1_1_N | CE0_1_N | ZQ_1_N | CE7_1_N | | VDD_CORE_0 |
| J | VDDI_1 | | VSS | VCC | R/B_0_N | R/B_2_N | R/B_3_N | R/B_1_N | VCC | VSS | | VDDI_0 |
| K | VDD_CORE_1 | | CE7_0_N | ZQ_0_N | CE0_0_N | CE1_0_N | VPP | WP_0_N | NC | CE5_1_N | | ANA_IT0_0 |
| L | NC | | VSS | VCCQ | CE2_0_N | CE3_0_N | CLE_0 | ALE_0 | VCCQ | VSS | | VQPS_0 |
| M | | | DQ7_0 | DQ6_0 | VREF_0 | WE_0_N | RE_0_C | DQS_0_C | DQ1_0 | DQ0_0 | | |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | CE6_0_N | CE4_0_N | | | | | NC | NC | NC | NC |
| T | NC | NC | NC | NC | NC | VDD_CORE_0 | VDDI_0 | ANA_IT0_0 | VQPS_0 | NC | NC | NC |
| U | NC | NC | NC | NC | | | | | NC | NC | NC | NC |

MEMORY DEVICE AND TEST OPERATION METHOD THEREOF

CROSS-REFERENCE TO RELATED APPLICATION

The present application claims priority under 35 U.S.C. § 119(a) to Korean patent application number 10-2019-0064089, filed on May 30, 2019, the entire disclosure of which is incorporated herein by reference in its entirety.

BACKGROUND

Field of Invention

The present disclosure relates to an electronic device, and more particularly, to an electronic device and a method of testing the same.

Description of Related Art

Recently, the paradigm for computing has seen rapid developments in ubiquitous computing, in which a computer system is used in mobile, on-demand computing situations. Therefore, uses of portable electronic devices such as mobile phones, digital cameras, and notebook computers are rapidly increasing. Such portable electronic devices generally employ memory systems that use memory devices such as data storage devices. Data storage devices may be used as a main storage device or an auxiliary storage device in the portable electronic device.

Data storage devices have certain advantages such as stability and durability because there are no mechanical drivers, the speed of access to stored information is very fast, and power consumption is low. As examples of memory systems that have such advantages, data storage devices may include a universal serial bus (USB) memory device, a memory card having various interfaces, a solid state drive (SSD), and the like.

Generally, memory devices may be divided into volatile memory devices and non-volatile memory devices.

A writing speed and a reading speed of a non-volatile memory device are relatively slow, however, the non-volatile memory device maintains storage data when there is no power supplied. Therefore, a non-volatile memory device is used when data needs to be retained regardless of power supply. Examples of non-volatile memory devices include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. In general, flash memories can be described as a NOR type and a NAND type of flash memory.

SUMMARY

An embodiment of the present disclosure provides a memory device and a method of testing the same capable of easily performing a test operation of an interface circuit by disposing a test pin of the interface circuit in a memory device in which the interface circuit and a semiconductor memory are packaged together.

A memory device in which an interface circuit and a semiconductor memory are packaged together according to an embodiment of the present disclosure includes a centrally located region in a ball mapping region of a memory device in which data input/output pins for an operation of the interface circuit and the semiconductor memory are disposed in a ball mapping region of the memory device, and a test pin region in which test pins for a test operation of the interface circuit are disposed.

A memory device in which an interface circuit and a semiconductor memory are packaged together according to an embodiment of the present disclosure includes a center region of a ball mapping region of a memory device in which a plurality of data input/output pins for an operation that is not a test operation of the interface circuit and the semiconductor memory are disposed, and a first test pin region in which a plurality of first test pins for a test operation of the interface circuit are disposed. Second a plurality of test pins used during the test operation of the interface circuit are disposed in the center region.

A method of operating a memory device according to an embodiment of the present disclosure includes providing a memory device including an interface circuit and a semiconductor memory connected to the interface circuit, receiving a test command corresponding to a test operation of the interface circuit to be performed by the interface circuit, performing a blocking operation to block signal transmission to the semiconductor memory from the interface circuit, and performing the test operation of the interface circuit in response to the test command.

Embodiments of the present disclosure easily perform a test operation of an interface circuit by disposing the test pin of the interface circuit in a memory device in which the interface circuit and a semiconductor memory are packaged together. In addition, malfunction of the memory device may be prevented by blocking signal transmission from the interface circuit to the memory device during a test operation of the interface circuit.

BRIEF DESCRIPTION OF THE DRAWINGS

FIG. 7 is a diagram illustrating packaging ball mapping of a packaged memory device.

FIG. 8 is a diagram illustrating packaging ball mapping of a memory device according to an embodiment of the present disclosure.

FIG. 11 is a diagram illustrating packaging ball mapping of a memory device shown in FIG. 10 according to an embodiment of the present disclosure.

FIG. 12 is a diagram illustrating packaging ball mapping of a memory device shown in FIG. 10 according to an embodiment of the present disclosure.

DETAILED DESCRIPTION

Figure 1:
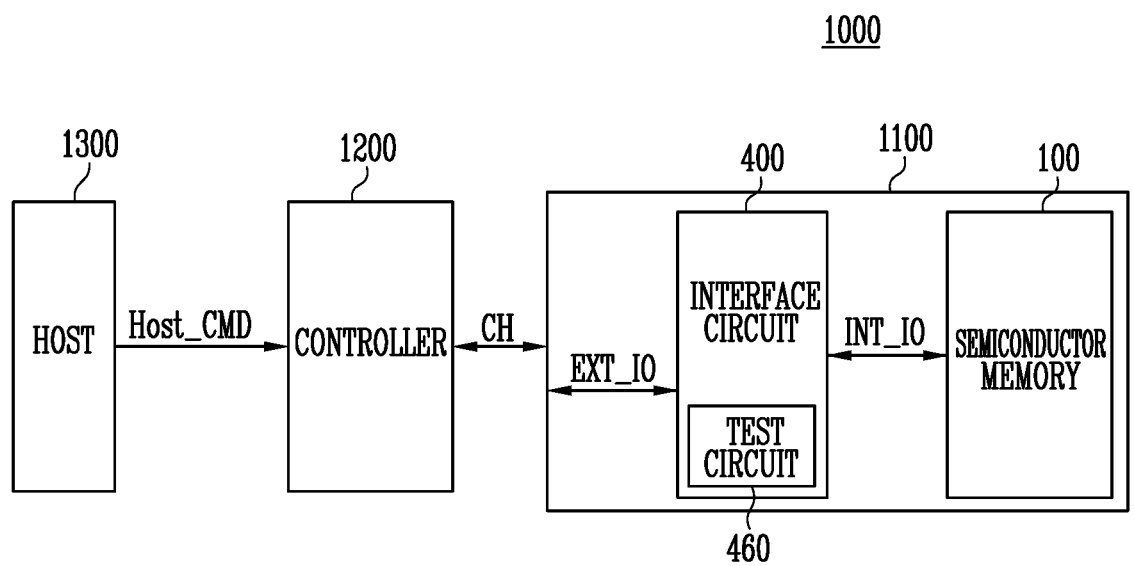
FIG. 1 is a block diagram describing a memory system according to an embodiment of the present disclosure.

Specific structural or functional descriptions of embodiments disclosed in the present specification or application are illustrated only to describe some embodiments according to concepts of the present disclosure. Embodiments of concepts of the present disclosure may be carried out in various forms and the descriptions are not limited to the embodiments described in the present specification or application.

Since various modifications and changes may be applied to embodiments concepts of the present disclosure, and the embodiments according to the concepts of the present disclosure may have various forms, some specific embodiments will be illustrated in the drawings and described in the present specification or application. However, it should be understood that embodiments of the present disclosure are not to be construed as limited to any specific disclosed form, and that all changes, equivalents, or substitutes that do not depart from the spirit and technical scope of the specification are contemplated by present disclosure.

While terms such as "first", "second", and/or the like may be used herein to describe various components, such components are not to be limited to the above-described terms. The above-described terms may be used only to distinguish one component from another component within this specification. For example, a first component may be referred to as a second component and similarly, a second component may be referred to as a first component without departing from the scope and concepts of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "between," "immediately between" or "adjacent to", "directly adjacent to", and the like should be construed in a similar manner.

The terms used in the present specification are merely used to describe specific embodiments, and are not intended to limit the present disclosure. Singular expression includes a plural expression, unless the context clearly indicates otherwise. In the present specification, it should be understood that the terms "include", "have", or the like indicate that a feature, a number, a step, an operation, a component, a part, or a combination thereof described in the present specification is present, but they do not exclude a possibility of presence or addition of one or more other features, numbers, steps, operations, components, parts, or combinations thereof.

So far as not being differently or individually defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, and should not be construed as having idealistic or excessively formal meanings.

In describing an embodiment, description of technical contents which are well known in the technical field of the present disclosure and are not directly related to the present disclosure will be omitted. This is intentional to disclose the present disclosure more clearly by omitting unnecessary description.

Hereinafter, embodiments of the present disclosure will be described in detail with reference to the accompanying drawings, so that those skilled in the art to which the present disclosure pertains may easily carry out the technical spirit of the present disclosure.

FIG. 1 is a block diagram describing a memory system according to an embodiment of the present disclosure.

Referring to FIG. 1, a memory system 1000 includes a memory device 1100 in which data is stored, and a controller 1200 that controls the memory device 1100, which is turn under the control of a host 1300.

The host 1300 may communicate with the controller 1200 by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 1300 and the controller 1200 is not limited to the above-described examples, and may be one of other interface protocols such as a universal serial bus (USB), a multi-media card (MMC), an enhanced small disk interface (ESDI), and integrated drive electronics (IDE).

The controller 1200 may generally control an operation of the memory system 1000 and control a data exchange between the host 1300 and the memory device 1100. For example, the controller 1200 may control the memory device 1100 to program or read data according to a request of the host 1300. In addition, the controller 1200 may generate commands relating to a test operation and transmit the commands to the memory device 1100 during the test operation of the memory device 1100.

The memory device 1100 may be connected to the controller 1200 through a channel CH, and may include a semiconductor memory 100 and an interface circuit 400. The semiconductor memory 100 may communicate with the controller 1200 through the interface circuit 400. For example, the interface circuit 400 may mediate command and data communication between the controller 1200 and the semiconductor memory 100. In addition, the interface circuit 400 may perform an operation of adjusting and rearranging a timing of the data exchanged between the controller 1200 and the semiconductor memory 100. The interface circuit 400 may rearrange the data exchanged between the controller 1200 and the semiconductor memory 100 to reduce any skew of transmitted data and to improve reliability. The interface circuit 400 may be connected to the channel CH through an external input/output line EXT_IO, and may be connected to the semiconductor memory 100 through an internal input/output line INT_IO.

In addition, the interface circuit 400 may include a test circuit 460 and may perform a test operation of the interface circuit 400 in response to a test command received from the controller 1200. In a test operation, the interface circuit 400 blocks transmission of the test command to the semiconductor memory 100 in order to prevent the test command from being transmitted to the semiconductor memory 100 and causing the semiconductor memory 100 to malfunction.

In another embodiment, the interface circuit 400 may receive a test command and test signals from an external test device (not shown) during the test operation. A test pin may be electrically connected to the external input/output line EXT_IO of the interface circuit 400.

During a test operation of the interface circuit 400, the interface circuit 400 may receive the test command and the test signals through the test pin, and output signals according to a test result through the test pin. To this end, the memory device 1100 may include a test pin PIN of the interface circuit 400. The test pin of the interface circuit 400 will be described in detail later with reference to FIG. 8.

According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

Figure 2:
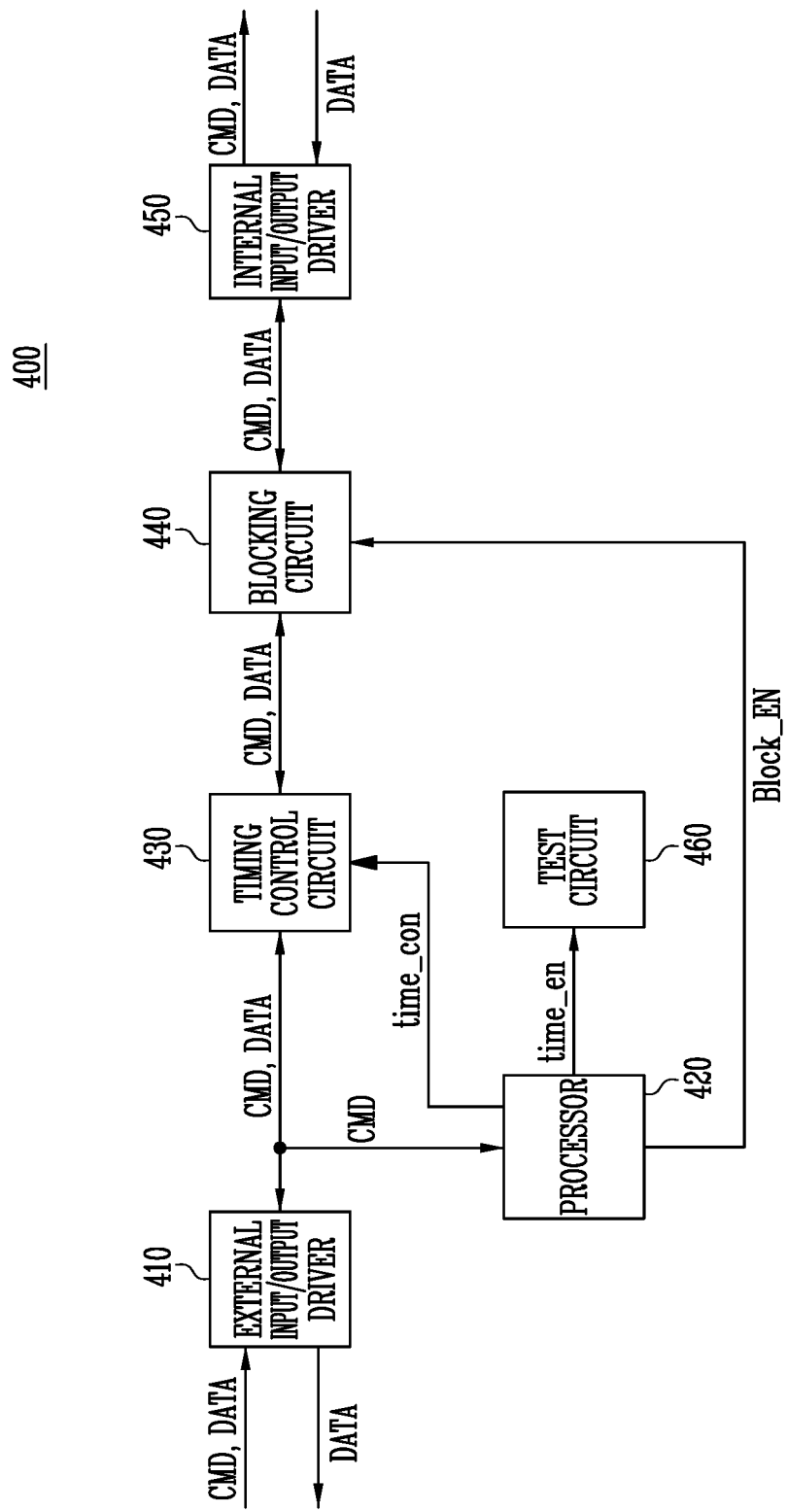
FIG. 2 is a block diagram describing a configuration of an interface circuit of FIG. 1 according to an embodiment of the present disclosure.

FIG. 2 is a block diagram describing a configuration of the interface circuit of FIG. 1 according to an embodiment of the disclosure.

Referring to FIG. 2, the interface circuit 400 may include an external input/output driver 410, a processor 420, a timing control circuit 430, a blocking circuit 440, an internal input/output driver 450, and a test circuit 460.

The external input/output driver 410 receives a command CMD and data DATA from the controller 1200 of FIG. 1 during a write operation and transmits the command CMD and the data DATA to the timing control circuit 430. In addition, the external input/output driver 410 transmits the received command CMD to the processor 420.

In addition, the external input/output driver 410 receives the data DATA from the timing control circuit 430 during a read operation and transmits the data DATA to the controller 1200 of FIG. 1.

During the test operation of the interface circuit 400, the interface circuit 400 may receive the command CMD and the data DATA through the test pin (not illustrated in FIG. 2) and output the data DATA according to the test result to an external test device through the test pin.

In an embodiment, the processor 420 receives a command CMD from the external input/output driver 410 and parses the received command CMD. As a result of parsing, if the received command CMD is a command CMD to be transmitted to the semiconductor memory 100 for an internal operation of the semiconductor memory 100 of FIG. 1, then the processor 420 deactivates and outputs a blocking enable signal Block_EN. In another embodiment, as a result of parsing, if the received command CMD corresponds to a command for a test operation of the interface circuit 400, then a test enable signal test_en is generated and output, and the blocking enable signal Block_EN is activated and output.

The processor 420 may include a register (not shown), and a plurality of addresses may be stored in the register. The plurality of addresses includes an address corresponding to the semiconductor memory 100 and an address corresponding to the interface circuit 400. The processor 420 may compare an address included in the command CMD and an address stored in the register during the parsing operation to determine whether the received command CMD refers to an operation involving the semiconductor memory 100 or testing of the interface circuit 400.

With respect to operations involving semiconductor memory 100, during a write operation, the timing control circuit 430 receives the command CMD and the data DATA from the external input and output driver 410, rearranges or process the command CMD and the data DATA, and outputs the rearranged or processed command CMD and data DATA to the blocking circuit 440. During a read operation, the timing control circuit 430 outputs the data DATA received from the blocking circuit 440 to the external input/output driver 410. The timing control circuit 430 adjusts and rearranges a timing of the received data DATA, in response to a timing control signal time_con output from the processor 420, and outputs the rearranged data DATA to the external input/output driver 410.

Similarly, the blocking circuit 440 transmits the command CMD and data DATA received from the timing control circuit 430 to the internal input/output driver 450 in a write operation, and transmits the data DATA received from the internal input/output driver 450 to the timing control circuit 430 in a read operation. Furthermore, the blocking circuit 440 performs a block operation in response to the blocking enable signal Block_EN activated during a test operation of the interface circuit 400 so that the command CMD and the data DATA received from the timing control circuit 430 are not transmitted to the internal input/output driver 450. That is, the blocking circuit 440 blocks signals transmitted between the interface circuit 400 and the semiconductor memory 100 during a test operation.

The internal input/output driver 450 receives the command CMD and the data DATA through the blocking circuit 440 and transmits the command CMD and the data DATA to the semiconductor memory 100 of FIG. 1 in a write operation, or transmits the data DATA received from the semiconductor memory 100 to the blocking circuit 440 in a read operation.

The test circuit 460 may perform a test of the interface circuit 400 in response to the test enable signal test_en received from the processor 420 during a test operation of the interface circuit 400, and may output the data according to the test operation result through the test pin (not shown).

Figure 3:
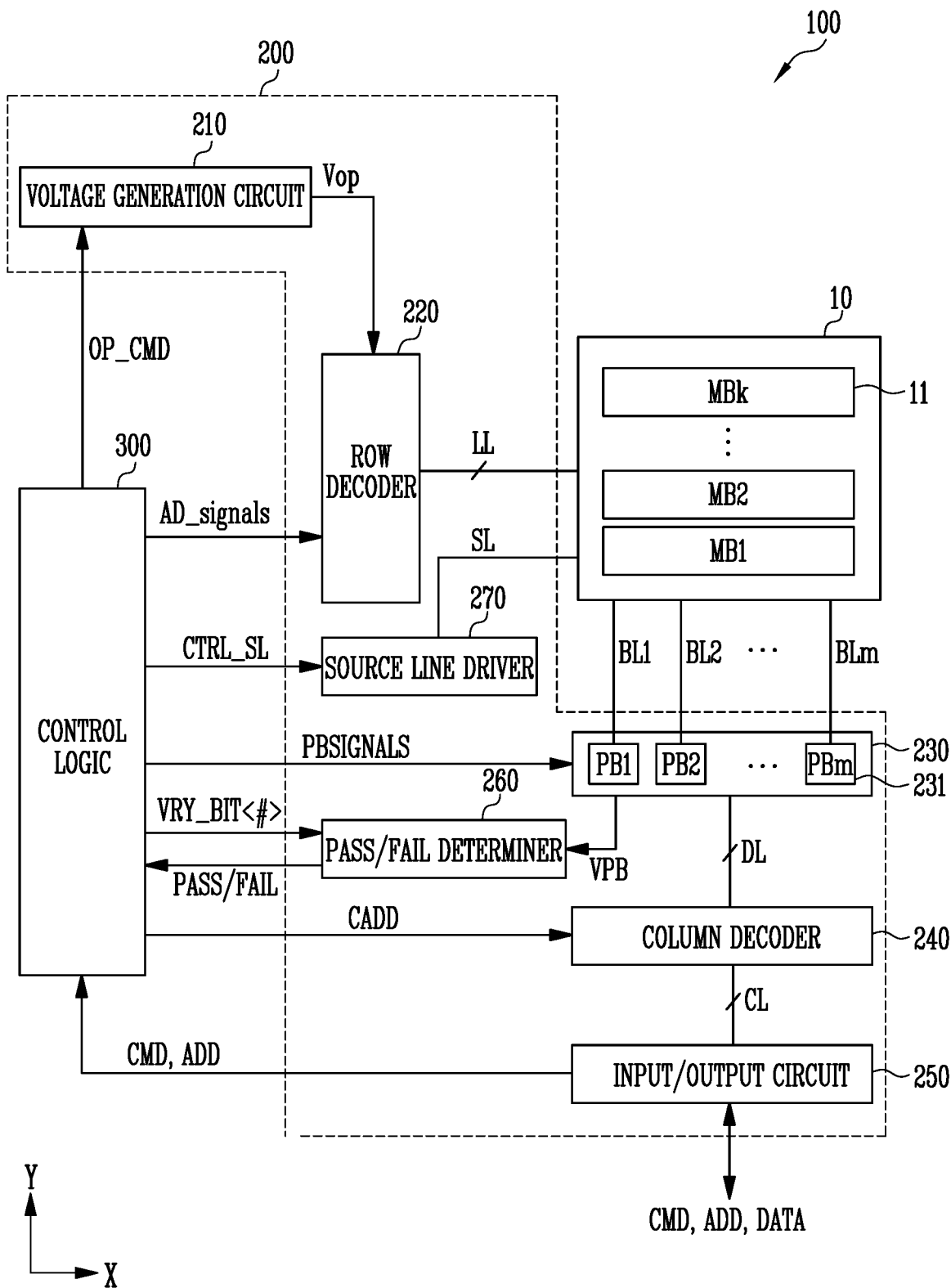
FIG. 3 is a diagram describing a semiconductor memory of FIG. 1 according to an embodiment of the present disclosure.

FIG. 3 is a diagram describing the semiconductor memory 100 of FIG. 1 according to an embodiment of the invention.

Referring to FIG. 3, the semiconductor memory 100 may include a memory cell array 10 in which data is stored. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 that controls the peripheral circuits 200 according to a command generated by the controller 1200 of FIG. 1 and received through the interface circuit 400 of FIG. 1.

The memory cell array 10 may include a memory block 11 in a plurality of memory blocks MB1 to MBk (where k is a positive integer). As an example, some of the memory blocks (for example, MB1) may store system data, while remaining memory blocks MB2 to MBk may store normal or non-system data. Local lines LL and bit lines BL1 to BLm (where m is a positive integer) may be connected to each of the plurality of memory blocks MB1 to MBk. For example, the local lines LL may include a first select line, a second select line, and a plurality of word lines arranged between the first and second select lines. In addition, the local lines LL may include dummy lines arranged between the first select line and the word lines, and arranged between the second select line and the word lines. Here, as an example, the first select line may be a source select line, and the second select line may be a drain select line. For example, the local lines LL may include word lines, drain and source select lines, and source lines SL. In a further example, the local lines LL may also include the dummy lines. In yet a further example, the local lines LL may further include pipe lines. The local lines LL may be connected to each of the plurality of memory blocks MB1 to MBk, respectively, and the bit lines BL1 to BLm may be commonly connected to the plurality of memory blocks MB1 to MBk. The plurality of memory blocks MB1 to MBk may be implemented in a two-dimensional or three-dimensional structure. For example, memory cells may be arranged in a direction parallel to a substrate in a memory block 11 of a two-dimensional structure. In a further example, the memory cells may be stacked in a direction perpendicular to the substrate in a memory block 11 of a three-dimensional structure.

The peripheral circuits 200 may be configured to perform, under control of the control logic 300, program, read, and erase operations on any of selected memory blocks 11. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations that take place in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a pass voltage, and a select transistor operation voltage under the control of the control logic 300.

The row decoder 220 may transfer the operation voltages Vop to the local lines LL connected to a selected memory block 11 in response to row decoder control signals AD_signals. For example, the row decoder 220 may selectively apply the operation voltages (for example, the program voltage, the verify voltage, the pass voltage, and the like), generated in the voltage generation circuit 210 in response to the row decoder control signals AD_signals, to the word lines of the local lines LL.

In response to the row decoder control signals AD_signals during a program voltage application operation, the row decoder 220 applies the program voltage generated in the voltage generation circuit 210 to the selected word line among the local lines LL and applies the pass voltage generated in the voltage generation circuit 210 to the remaining unselected word lines. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during the read operation.

The page buffer group 230 may include a plurality of page buffers 231 (PB1 to PBm) respectively connected to the bit lines BL1 to BLm. The page buffers PB1 to PBm may operate in response to page buffer control signals PBSIGNALS. For example, the page buffers PB1 to PBm may temporarily store data to be programmed during a program operation, or sense a voltage or a current of the bit lines BL1 to BLm during a read operation or a verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and an address ADD received from the controller 1200 of FIG. 1 to the control logic 300, or may exchange the data DATA with the column decoder 240.

The pass/fail determiner 260 may generate a reference current in response to a permission bit VRY_BIT<#> during a read operation or a verify operation, compare a sensing voltage VPB received from the page buffer group 230 with a reference voltage generated by the reference current, and output a pass signal PASS or a fail signal FAIL.

The source line driver 270 may be connected to a memory cell included in the memory cell array 10 through the source line SL, and may control a voltage applied to the source line SL. The source line driver 270 may receive a source line control signal CTRL_SL from the control logic 300, and may control a source line voltage applied to the source line SL based on the source line control signal CTRL_SL.

The control logic 300 may output an operation signal OP_CMD, the row decoder control signals AD_signals, the page buffer control signals PBSIGNALS, and the permission bit VRY_BIT<#> in response to the command CMD, and the address ADD to control the peripheral circuits 200. In addition, the control logic 300 may determine whether the verify operation is passed or failed in response to the pass signal PASS or the fail signal FAIL from the pass/fail determiner 260.

Figure 4:
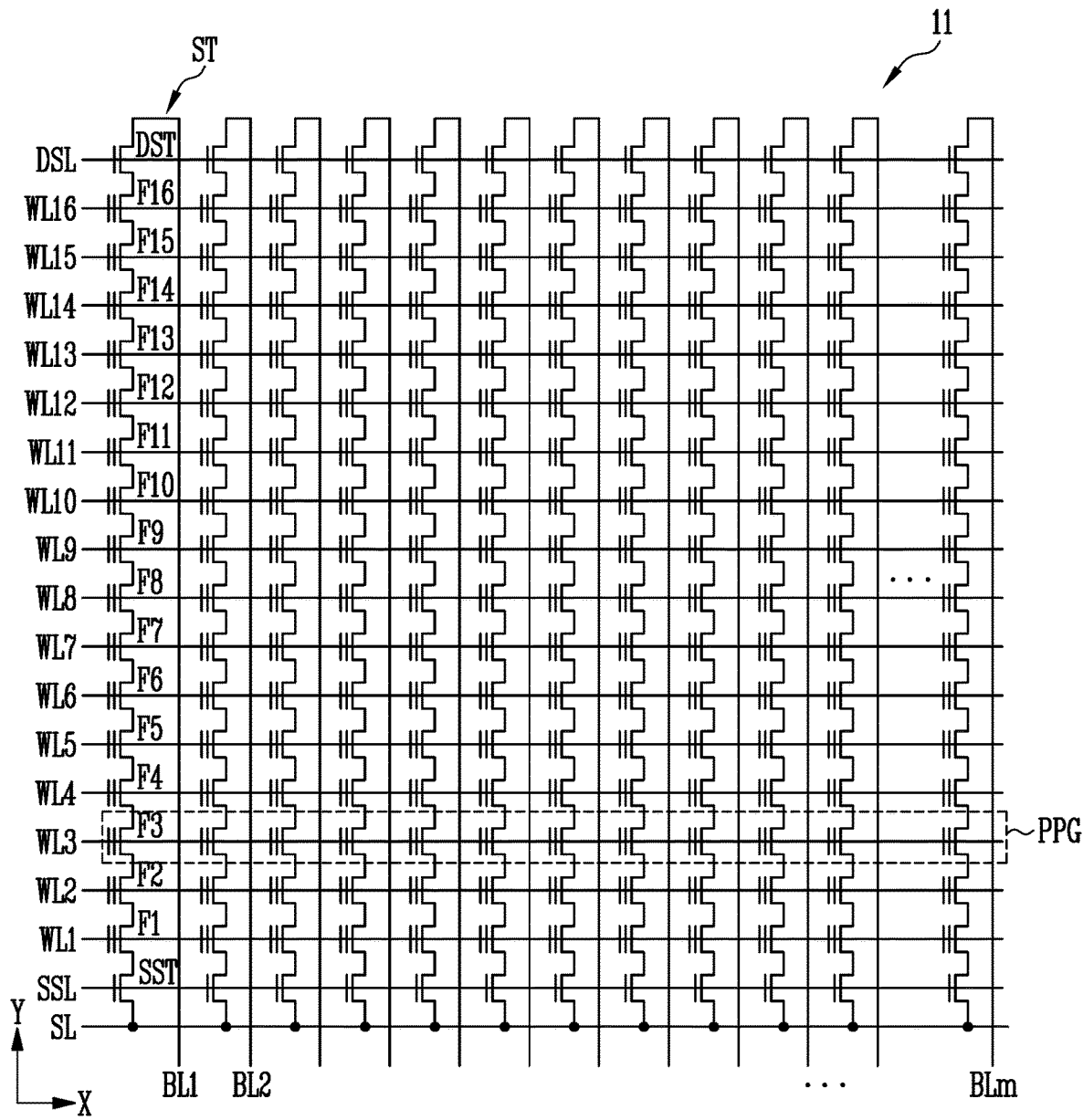
FIG. 4 is a diagram describing a memory block of FIG. 3 according to an embodiment of the present disclosure.

FIG. 4 is a diagram describing a memory block of FIG. 3 according to an embodiment of the present disclosure.

Referring to FIG. 4, a memory block 11 may be connected to a plurality of word lines arranged in parallel to each other between the first select line and the second select line. In an example, the first select line may be the source select line SSL, and the second select line may be the drain select line DSL. More specifically, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical or substantially identical to each other, a string ST connected to the first bit line BL1 will be specifically described as an example.

As an example, the string ST may include a source select transistor SST, a plurality of memory cells F1 to F16, and a drain select transistor DST connected in series between the source line SL and the first bit line BL1. In other examples, a string ST may include at least one or more of the source select transistor SST and the drain select transistor DST, and may include more memory cells that memory cells F1 to F16 shown in FIG. 4.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In other instances, one memory cell may store two or more bits of data. This is commonly referred to as a multi-level cell (MLC). In such cases, one physical page PPG may store two or more logical page (LPG) data.

Figure 5:
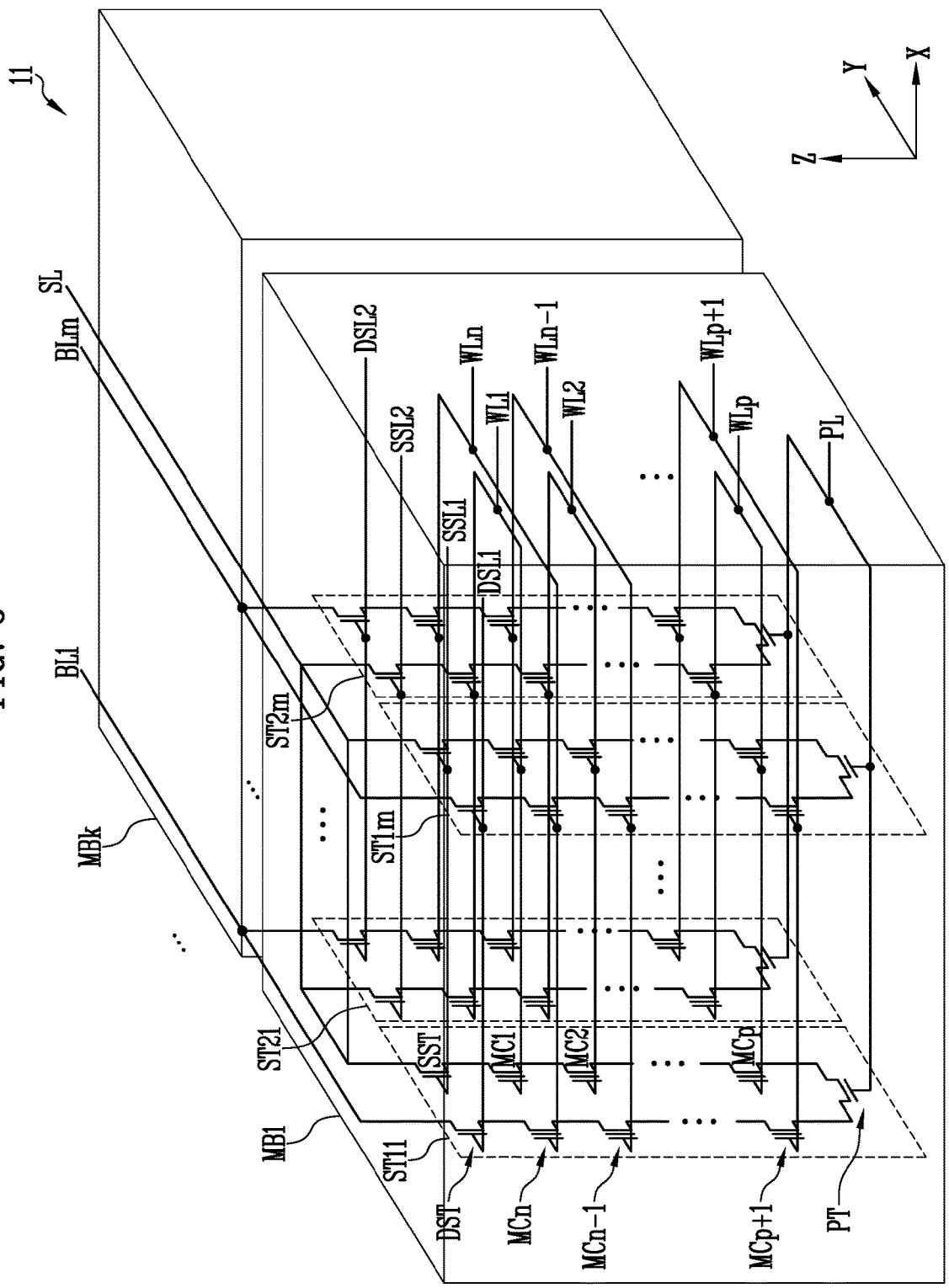
FIG. 5 is a three-dimensional illustration of a memory block of the memory cell array 10 in FIG. 3 according to an embodiment of the present disclosure.

FIG. 5 is a three-dimensional illustration of a memory block of the memory cell array 10 in FIG. 3 according to an embodiment of the present disclosure.

Referring to FIG. 5, the memory cell array 10 may include a plurality of memory blocks MB1 to MBk. Each memory block 11 may include a plurality of strings ST11 to ST1m and ST21 to ST2m. In an embodiment, each of the plurality of strings ST11 to ST1m and ST21 to ST2m may be formed in a U shape on a Y-Z plane. In the first memory block MB1, m strings may be arranged in a row direction (X direction). In FIG. 5, two strings (for example, ST11 and ST21) are arranged in a column direction (Y direction), but this is for convenience of description, and three or more strings may be arranged in the column direction (Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. In some examples, a pillar for providing the channel film may be provided in each string. For instance, a pillar for providing at least one of the channel film, the tunnel insulating film, the charge trap film, and the blocking insulating film may be provided in each string.

The source select transistor SST of each string may be connected between the source line SL and the memory cells MC1 to MCp.

In an embodiment, the source select transistors of the strings arranged in the same row may be connected to a source select line SSL extending in the row direction, while the source select transistors of the strings arranged in different rows may be connected to different source select lines. In FIG. 5, the source select transistors of the strings ST11 to ST1m of a first row may be connected to a first source select line SSL1. The source select transistors of the strings ST21 to ST2m of a second row may be connected to a second source select line SSL2.

In another embodiment, the source select transistors of the strings ST11 to ST1m and ST21 to ST2m may be commonly connected to one or the same source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and a pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to n-th word lines WL1 to WLn, respectively.

In an embodiment, at least one of the first to n-th memory cells MC1 to MCn may be used as a dummy memory cell. When the dummy memory cell is used, a voltage or a current of a corresponding string may be stably controlled. A gate of the pipe transistor PT of each string may be connected to a pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 5, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 of the strings ST11 to ST1m of the first row may configure one page. The memory cells connected to the first word line WL1 of the strings ST21 to ST2m of the second row may configure another page. If one of the drain select lines DSL1 and DSL2 is selected, then the strings arranged in one row direction may be selected. If one of the word lines WL1 to WLn is selected, then one page may be selected among the selected strings.

Figure 6:
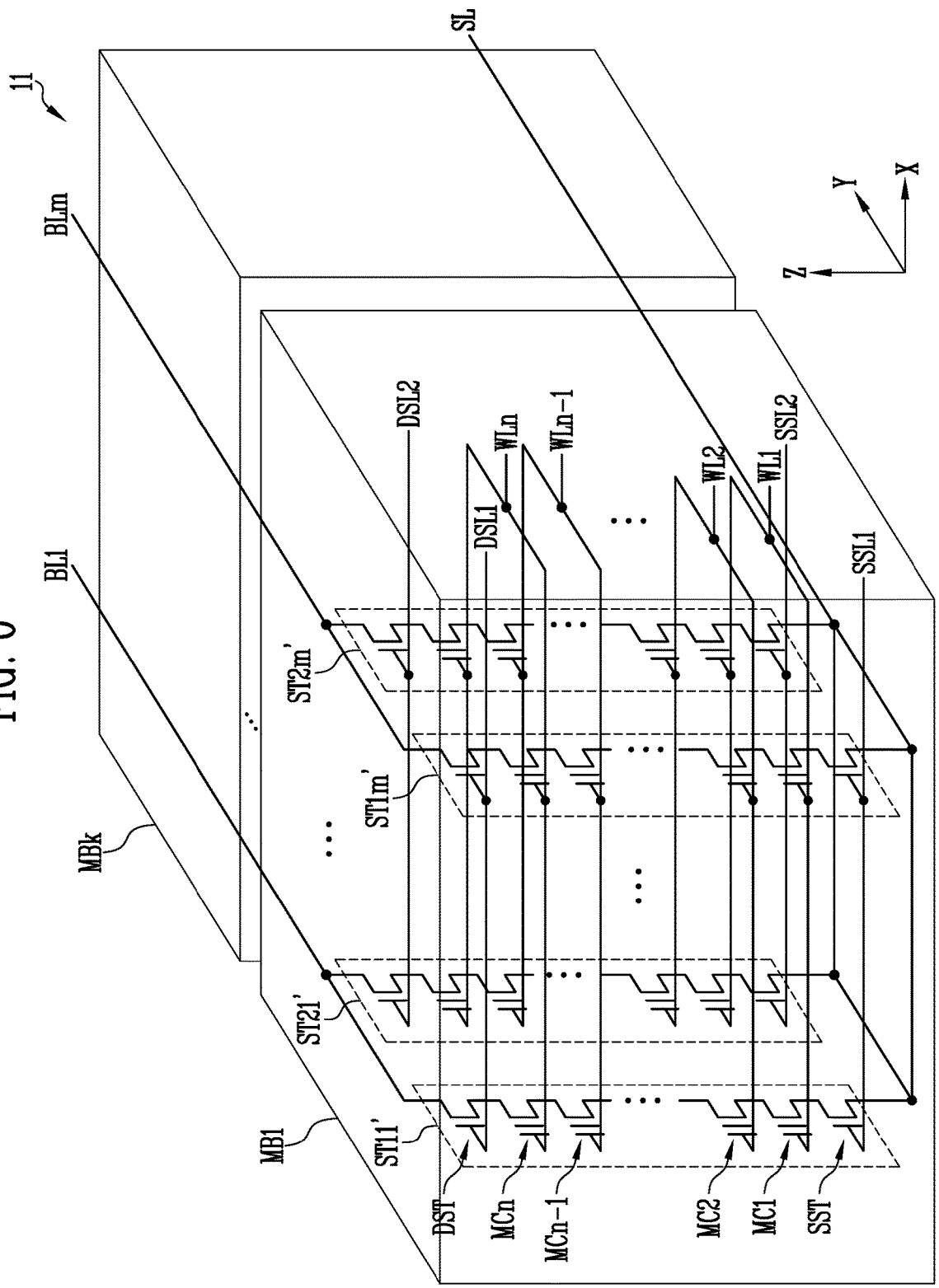
FIG. 6 is a three-dimensional illustration of a memory block of the memory cell array in FIG. 3 according to an embodiment of the present disclosure.

FIG. 6 is a three-dimensional illustration of a memory block of the memory cell array 10 in FIG. 3, according to an embodiment of the present disclosure.

Referring to FIG. 6, the memory cell array 10 may include a plurality of memory blocks (MB1 to MBk). A memory block 11 may include a plurality of strings ST11' to ST1m' and ST21' to ST2m'. Each of the plurality of strings ST11' to ST1m' and ST21' to ST2m' may extend along the vertical direction (Z direction). In the memory block 11, m strings may be arranged in the row direction (X direction). In FIG. 6, two strings (ST11' and ST21') are arranged in the column direction (Y direction), but this is for convenience of description, and three or more strings may be arranged in the column direction (Y direction).

Each of the plurality of strings ST11' to ST1m' and ST21' to ST2m' to ST2m may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. For example, the source select transistors of the strings ST11' to ST1m' arranged in the first row may be connected to a first source select line SSL1. The source select transistors of the strings ST21' to ST2m' arranged in the second row may be connected to a second source select line SSL2. In another embodiment, the source select transistors of the strings ST11' to ST1m' and ST21' to ST2m' may be commonly connected to one or the same source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

In an embodiment, at least one of the first to n-th memory cells MC1 to MCn may be used as a dummy memory cell. When a dummy memory cell is utilized, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. As an example, the drain select transistors DST of the strings ST11' to ST1m' of the first row may be connected to a first drain select line DSL1. The drain select transistors DST of the strings ST21' to ST2m' of the second row may be connected to a second drain select line DSL2.

FIG. 7 is a diagram illustrating packaging ball mapping of a packaged memory device.

Referring to FIG. 7, a packaged memory device has ball mapping in a matrix structure. A plurality of data input/output pins are disposed in a center region of the ball mapping of the matrix structure and are externally connected (for example, connected through a border or boundary structure) through a ball out process. A corner region of the ball mapping may be vulnerable to external influences such as temperature, process damage, and the like, and thus non-connecting pins NC that are not substantially used may be disposed in the corner regions of the ball mapping. In addition, some of the pins in the center region may also be non-connecting pins NC.

In an example of a packaged memory device, a plurality of data input/output pins that are used for all operations of the packaged memory device are disposed only in the central region of the ball mapping, that is, the plurality of data input/output pins are used for transmission of signals and data during an operation of the memory device. There is no test pin utilized for the testing of the interface circuit included in this example of a packaged memory device.

FIG. 8 is a diagram illustrating packaging ball mapping of a memory device according to an embodiment of the present disclosure.

Referring to FIG. 8, a packaged memory device has ball mapping in a matrix structure. In a central region of a packaging ball mapping of a matrix structure, denoted NAND_PKG_BALL in FIG. 8, a plurality of input/output pins connected to the semiconductor memory 100 of FIG. 1 of memory device 1100 are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1, CE0_1_N to CE3_1_N, R/B_0_N to R/B_3_N, ZQ_0_N, ZQ_1_N, WP_0_N, and the like. The plurality of input/output pins may be bonded to an outer or external border or structure through a ball out process. During normal operation of an interface circuit and a semiconductor memory included in a memory device, the plurality of input/output pins receive power and a signal from an external source through a border or structure, or transmit signals output from the interface circuit and the semiconductor memory through a border or structure, for example, signals received or transmitted, from or to the controller.

In addition, in the memory device, the non-connecting pins NC are disposed in each of corner regions EDGE_A, EDGE_B, EDGE_C, and EDGE_D of the packaging ball mapping region of the matrix structure.

In addition, in the memory device, certain remaining vacant regions outside of the region NAND_PKG_BALL and each of the corner regions EDGE_A, EDGE_B, EDGE_C, and EDGE_D are defined as interface circuit test pin regions Interface_test_PIN_A and Interface_test_PIN_B. In these regions, test pins VQPS_1, ANA_ITO_1, VDDI_1, VDD_CORE_1, VDD_CORE_0, VDDI_0, ANA_ITO_0, and VQPS_0 used in the testing of the interface circuit are disposed, as shown in FIG. 8 in the interface circuit test pin regions Interface_test_PIN_A and Interface_test_PIN_B.

The interface circuit test pin regions Interface_test_PIN_A and Interface_test_PIN_B may be disposed on at the sides of region NAND_PKG_BALL as shown in FIG. 8, however, the locations of of Interface_test_PIN_A and Interface_test_PIN_B in the packaging ball mapping are not limited thereto. For example, Interface_test_PIN_A and Interface_test_PIN_B may be disposed at unused upper and lower positions relative to region NAND_PKG_BALL.

The test pins VQPS_1, ANA_ITO_1, VDDI_1, VDD_CORE_1, VDD_CORE_0, VDDI_0, ANA_ITO_0, and VQPS_0 for the testing of an interface circuit may not perform a ball out process and thus are not bonded to the outer border. The test pins may be disposed in a form of a pin to be exposed to the outside of the packaged memory device, and may be connected to an external test device through a probe during the test operation.

According to an embodiment of the present disclosure, in the memory device, some of the remaining blank regions outside of region NAND_PKG_BALL and each of the corner regions EDGE_A, EDGE_B, EDGE_C, and EDGE_D of the packaging ball mapping region of the matrix structure are defined as interface circuit test pin regions Interface_test_PIN_A and Interface_test_PIN_B, and the test pins of the interface circuit are disposed in the interface circuit test pin regions Interface_test_PIN_A and Interface_test_PIN_B. Therefore, testing of the interface circuit may be easily performed.

In embodiments of the present disclosure, the test pins P IN are included in the packaging ball mapping for the testing of the interface circuit. Embodiments of the present disclosure are not, however, limited thereto, and a pad that is exposed to the outside of the packaged memory device may be used instead of the pin.

Figure 9:
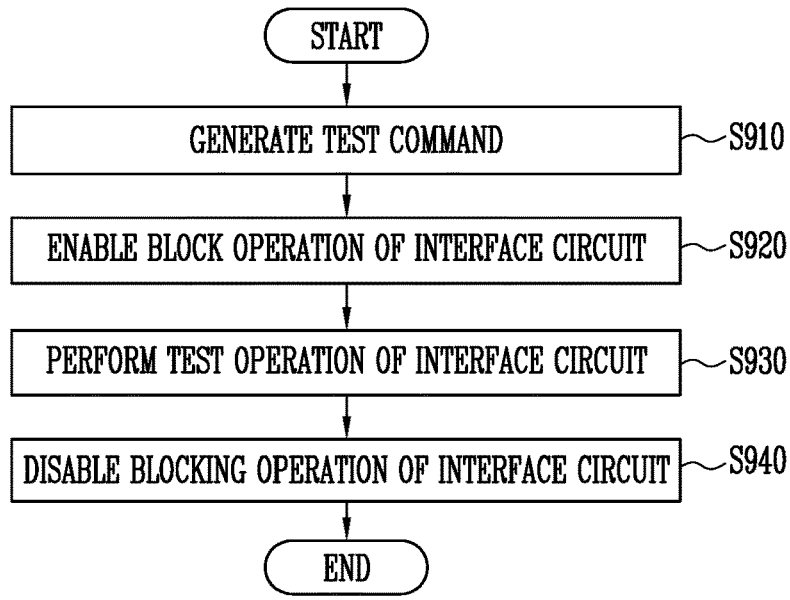
FIG. 9 is a flowchart illustrating a test operation of a memory device according to an embodiment of the present disclosure.

FIG. 9 is a flowchart illustrating a test operation of a memory device according to an embodiment of the present disclosure.

The test operation of the memory device will be described with reference to FIGS. 1, 2, and 9 as follows.

The controller 1200 generates and outputs a test command CMD for a test operation of the interface circuit 400 of memory device 1100 (S910). The command CMD may include an address, and the address may be an address corresponding to the interface circuit 400.

The interface circuit 400 of the memory device 1100 receives the test command CMD from the controller 1200 and enables a blocking operation in response to the test command CMD (S920).

The blocking operation of the interface circuit 400 is described as follows.

The external input/output driver 410 receives the test command CMD from the controller 1200 and transmits the test command CMD to the processor 420. The processor 420 receives the test command CMD from the external input/output driver 410 and parses the received test command CMD. When the parsed received test command CMD corresponds to the test operation of the interface circuit 400, the test enable signal test_en and the blocking enable signal Block_EN are generated and output. The blocking circuit 440 performs the blocking operation in response to the blocking enable signal Block_EN so that the test command CMD received from the timing control circuit 430 is not transmitted to the internal input/output driver 450.

The test circuit 460 of the interface circuit 400 performs the test operation in response to the test enable signal test_en (S930). During the test operation, the test circuit 460 may receive signals necessary for the test operation using the test pins for the testing of the interface circuit, and output the signals generated as a result of the test operation to the outside through the test pins.

After the test operation is completed, the processor 420 disables the blocking enable signal Block_EN to disable the blocking operation (S940).

As described above, in embodiments of the present disclosure, during the test operation of the interface circuit 400, the blocking operation is performed to prevent the test command from being transmitted from the interface circuit 400 to the semiconductor memory 100. Therefore, during the test operation of the interface circuit 400, malfunction of the semiconductor memory 100 after receiving the test command may be prevented.

Figure 10:
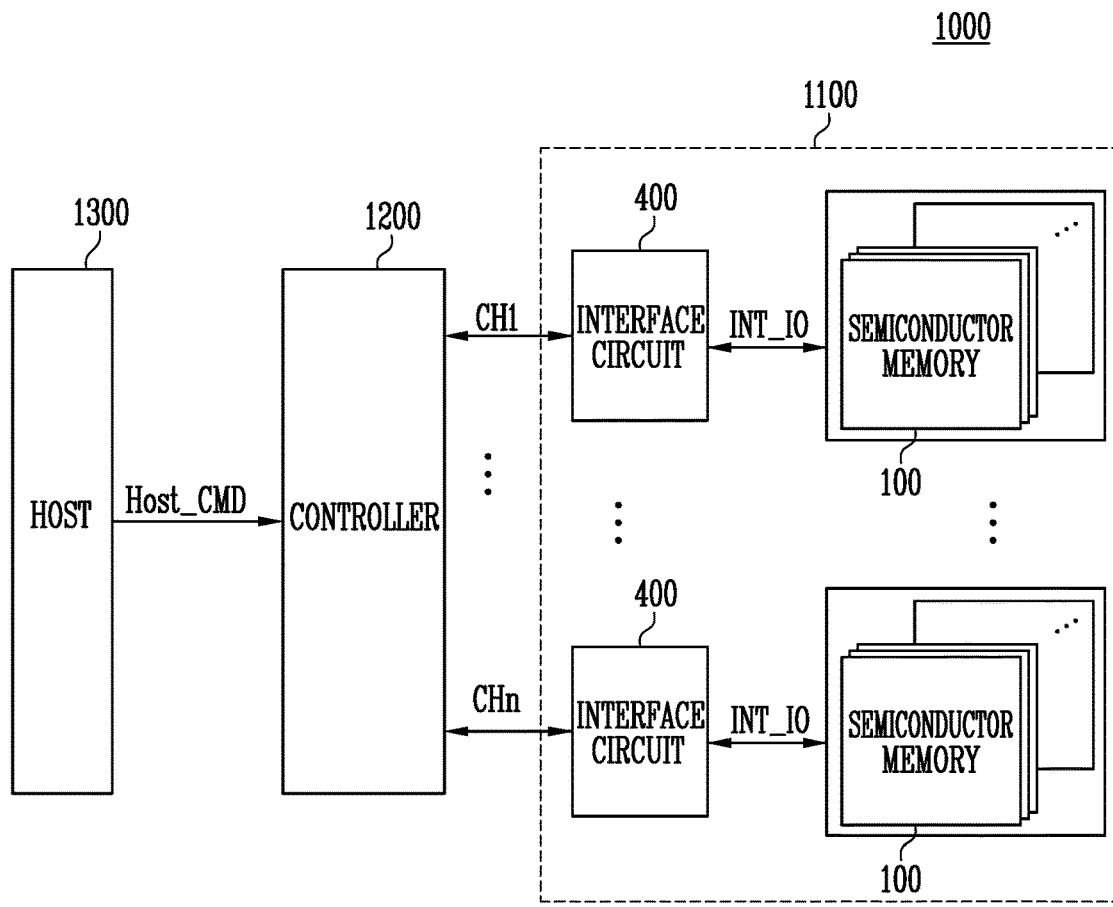
FIG. 10 is a diagram describing a memory system according to an embodiment of the present disclosure.

FIG. 10 is a diagram describing a memory system according to an embodiment of the present disclosure.

Referring to FIG. 10, a memory system 1000 includes a memory device 1100 and a controller 1200. The memory device 1100 includes a plurality of semiconductor memories 100 and a plurality of interface circuits 400. Each of the plurality of semiconductor memories 100 may be divided into a plurality of groups, and each of the plurality of groups including a plurality of semiconductor memories may be connected to one interface circuit 400 through an internal input/output line INT_IO.

In FIG. 10, the plurality of interface circuits 400 communicate with the controller 1200 through first to n-th channels CH1 to CHn, respectively. Therefore, the plurality of semiconductor memories 100 included in one group are configured to communicate with the controller 1200 through one interface circuit 400 and a common channel CH. The controller 1200 is configured to control the plurality of semiconductor memories 100 of the memory device 1100 through the plurality of channels CH1 to CHn.

The controller 1200 may generally control an operation of the memory system 1000 and may control data exchange between the host 1300 and the memory device 1100. The controller 1200 may control the plurality of semiconductor memories 100 included in the memory device 1100 to program or read data according to request from the host 1300. In addition, the controller 1200 may perform a training operation to train the interface circuits 400 included in the memory device 1100 or perform a training operation to train the semiconductor memories 100 according to requests of the host 1300. In addition, the controller 1200 may perform the training of the interface circuits 400 or the training of the semiconductor memories 100 after a power-up operation. The controller 1200 may generate a command for controlling the semiconductor memory 100 or the interface circuits 400 and transmit the command to the memory device 1100. In this instance, the command for controlling the memory device 1100 includes an address corresponding to at least one of the plurality of semiconductor memories 100 included in the memory device 1100, and the command for controlling the interface circuits 400 includes an address corresponding to the interface circuits 400.

An interface circuit 400 of FIG. 10 may be configured and operated in substantially the same manner as the interface circuit 400 of FIG. 2 as described above. Therefore, if a specific command received from the controller 1200 corresponds to an interface circuit 400, then the interface circuit 400 may perform a write training operation and a read training operation in response to the received specific command, and the specific command is not transmitted to the semiconductor memory 100 by performing a blocking operation. If a specific command received from the controller 1200 corresponds to the semiconductor memory 100, then the interface circuit 400 transmits the received specific command to the semiconductor memory 100 without performing a blocking operation.

The controller 1200 and the semiconductor memory device 1100 may be integrated into a single semiconductor device. As an exemplary embodiment, the controller 1200 and the memory device 1100 may be integrated into one semiconductor device to form a memory card. In examples, the controller 1200 and the memory device 1100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is included in a semiconductor drive (SSD), an operation speed of the host 1300 connected to the memory system 1000 is dramatically improved.

As another example, the memory system 1000 is provided as one of various components of an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an exemplary embodiment, the memory device 1100 or memory system 1000 may be mounted as a package of various types. For example, the memory device 1100, or the memory system 1000, may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP).

The plurality of interface circuits 400 included in the memory device 1100 described above and with reference to FIG. 10 may communicate with the controller 1200 through the first to n-th channels CH1 to CHn, and one interface circuit 400 may communicate with the plurality of semiconductor memories 100.

Therefore, the memory device 1100 may operate in a single channel method using a single interface circuit 400, or may operate in a multi-channel method using at least two of the plurality of interface circuits 400.

In order to test the multi-channel method described above, additional test signals are required, and the memory device 1100 requires test pins for receiving the additional test signals.

FIG. 11 is a diagram illustrating packaging ball mapping of the memory device 1100 shown in FIG. 10 according to an embodiment of the present disclosure.

Referring to FIG. 11, a packaged memory device has a ball mapping in a matrix structure. In a center region (NAND_PKG_BALL) of a packaging ball mapping of the matrix structure, a plurality of input/output pins, connected to the semiconductor memory 100 of FIG. 1 included in the memory device, are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1, CE0_1_N to CE3_1_N, R/B_0_N to R/B_3_N, ZQ_0_N, ZQ_1_N, WP_0_N, and the like. The plurality of input/output pins may be bonded to or through an outer border through a ball out process.

In addition, in the memory device, non-connecting pins NC are disposed in each of corner regions EDGE_A, EDGE_B, EDGE_C, and EDGE_D of the packaging ball mapping region of the matrix structure.

In addition, in the memory device, some remaining vacant regions except for the centered region NAND_PKG_BALL and each of the corner regions EDGE_A, EDGE_B, EDGE_C, and EDGE_D are defined as interface circuit test pin regions Interface_test_PIN_A and Interface_test_PIN_B. Test pins VQPS_1, ANA_ITO_1, VDDI_1, VDD_CORE_1, VDD_CORE_0, VDDI_0, ANA_ITO_0, and VQPS_0 for testing the interface circuit are disposed in the interface circuit test pin regions Interface_test_PIN_A and Interface_test_PIN_B.

The interface circuit test pin regions Interface_test_PIN_A and Interface_test_PIN_B may be disposed on both sides of the center region NAND_PKG_BALL as shown in FIG. 11, however, the regions are not limited to the sides of the center region and may be disposed at upper and lower positions relative to region NAND_PKG_BALL.

The test pins VQPS_1, ANA_ITO_1, VDDI_1, VDD_CORE_1, VDD_CORE_0, VDDI_0, ANA_ITO_0, and VQPS_0 for the test of the interface circuit, which may not perform a ball out process, may be disposed in a pin state, and may be connected to an external test device through a probe during the test operation.

In some embodiments, a test pin TEST_PIN for testing a multi-channel operation of the interface circuit is disposed, and the test pin TEST_PIN utilizes some of the non-connecting pins NC disposed in the each of the corner regions EDGE_A, EDGE_B, EDGE_C, and EDGE_D and some of the non-connecting pins NC disposed in the center region NAND_PKG_BALL. For example, a pin corresponding to C4 in the corner region EDGE_A is utilized as a CE_MUX pin (CE_MUX) and pins corresponding to C10 and C11 in the corner region EDGE_B are utilized as a CE4_1_N pin (CE4_1_N) and a CE6_1_N pin (CE6_1_N). In addition, pins corresponding to H6, H11, K3, and K11 in the center region NAND_PKG_BALL are utilized as CE5_0_N pin (CE5_0_N), CE7_1_N pin (CE7_1_N), CE7_0_N pin (CE7_0_N), and CE5_1_N pin (CE5_1_N). The test pins (TEST_PIN) are preferably disposed adjacent to the center region NAND_PKG_BALL in each of the corner regions EDGE_A, EDGE_B, EDGE_C, and EDGE_D. In addition, pins corresponding to R3 and R4 in the corner region EDGE_C are utilized as CE_0_N pin (CE_0_N) and CE4_0_N pin (CE4_0_N).

Thus as described above, some of the non-connecting pins of the edge regions or the center region may be utilized as the test pins for test operations of the interface circuit.

FIG. 12 is a diagram illustrating packaging ball mapping of a memory device 1100 shown in FIG. 10 according to an embodiment of the disclosure.

Referring to FIG. 12, the packaged memory device has a ball mapping of a matrix structure. In a centered region NAND_PKG_BALL of a packaging ball mapping in a matrix structure, a plurality of input/output pins, connected to the semiconductor memory 100 of FIG. 1 included in the memory device, are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1, CE0_1_N to CE3_1_N, R/B_0_N to R/B_3_N, ZQ_0_N, ZQ_1_N, WP_0_N, and the like. The plurality of input/output pins that are bonded to or through an outer border through a ball out process.

In addition, in the memory device, the non-connecting pins NC are disposed in each of corner regions EDGE_A, EDGE_B, EDGE_C, and EDGE_D of the packaging ball mapping region of the matrix structure.

In addition, in the memory device, some remaining vacant regions outside of region NAND_PKG_ALL and the edge regions EDGE_A, EDGE_B, EDGE_C, and EDGE_D are defined as the interface circuit test pin regions Interface_test_PIN_A and Interface_test_PIN_B, and NAND test pin regions Nand_test_PIN_A and Nand_test_PIN_B. In addition, the test pins VQPS_1, ANA_ITO_1, VDDI_1, VDD_CORE_1, VDD_CORE_0, VDDI_0, ANA_ITO_0, and VQPS_0 for the test of the interface circuit 400 of FIG. 10 are disposed in the interface circuit test pin regions Interface_test_PIN_A and Interface_test_PIN_B, and test pins VQPS_1, ANA_ITO_1, VDDI_1, VDD_CORE_1, VDD_CORE_0, VDDI_0, ANA_ITO_0, and VQPS_0 for the test of the semiconductor memories 100 of FIG. 10 are disposed in the NAND test pin regions Nand_test_PIN_A and Nand_test_PIN_B.

The interface circuit test pin regions Interface_test_PIN_A and Interface_test_PIN_B may be disposed on the sides of the center region NAND_PKG_BALL as shown in FIG. 12, but their locations are not limited thereto. In other examples, Interface_test_PIN_A and Interface_test_PIN_B may be disposed at upper and lower positions relative to the center region NAND_PKG_BALL. In addition, the NAND test pin regions Nand_test_PIN_A and Nand_test_PIN_B may be disposed on both sides of the center region NAND_PKG_BALL as shown in FIG. 12, but are not limited thereto, and may be disposed at upper and lower regions relative to the center region NAND_PKG_BALL.

The test pins VQPS_1, ANA_ITO_1, VDDI_1, VDD_CORE_1, VDD_CORE_0, VDDI_0, ANA_ITO_0, and VQPS_0 for the test of the interface circuit and the test pins VQPS_1, ANA_ITO_1, VDDI_1, VDD_CORE_1, VDD_CORE_0, VDDI_0, ANA_ITO_0, and VQPS_0 for the test of the semiconductor memory may not perform a ball out process. Therefore, the test pins may be disposed in a pin state, and may be connected to an external test device through a probe during the test operation.

In addition, a test pin (TEST_PIN) for testing the multi-channel operations of the interface circuit is also disposed in the packaging ball mapping, and the test pin (TEST_PIN) utilizes some of the non-connecting pins NC disposed in the each of the corner regions EDGE_A, EDGE_B, EDGE_C, and EDGE_D and some of the non-connecting pins NC disposed in the center region NAND_PKG_BALL. For example, a pin corresponding to C4 in the corner region EDGE_A is utilized as a CE_MUX pin (CE_MUX) and pins corresponding to C10 and C11 in the corner region EDGE_B are utilized as a CE4_1_N pin (CE4_1_N) and a CE6_1_N pin (CE6_1_N). The test pins TEST_PIN are preferably disposed adjacent to the center region NAND_PKG_BALL in each of the corner regions EDGE_A, EDGE_B, EDGE_C, and EDGE_D. In addition, pins corresponding to H6, H11, K3, and K11 in the center region NAND_PKG_BALL are utilized as CE5_0_N pin (CE5_0_N), CE7_1_N pin (CE7_1_N), CE7_0_N pin (CE7_0_N), and CE5_1_N pin (CE5_1_N). In addition, pins corresponding to R3 and R4 in the corner region EDGE_C are utilized as CE_0_N pin (CE_0_N) and CE4_0_N pin (CE4_0_N).

Therefore, in embodiments contemplated by this disclosure, some of the non-connecting pins of the edge regions or the center region may be utilized as the test pins for test operation of the interface circuit.

As described above, in embodiments of the present disclosure, test pins for testing operations of the interface circuit and test pins for testing operations of the semiconductor memory are provided. Therefore, the test operation of the interface circuit and the test operation of the semiconductor memory may be performed in parallel. Thus, the time required for a test operation may be reduced.

In addition, during a test operation of a semiconductor memory, the semiconductor memory may be directly tested without performing a test operation of the semiconductor memory through the interface circuit, thereby improving reliability of the test operation.

Figure 13:
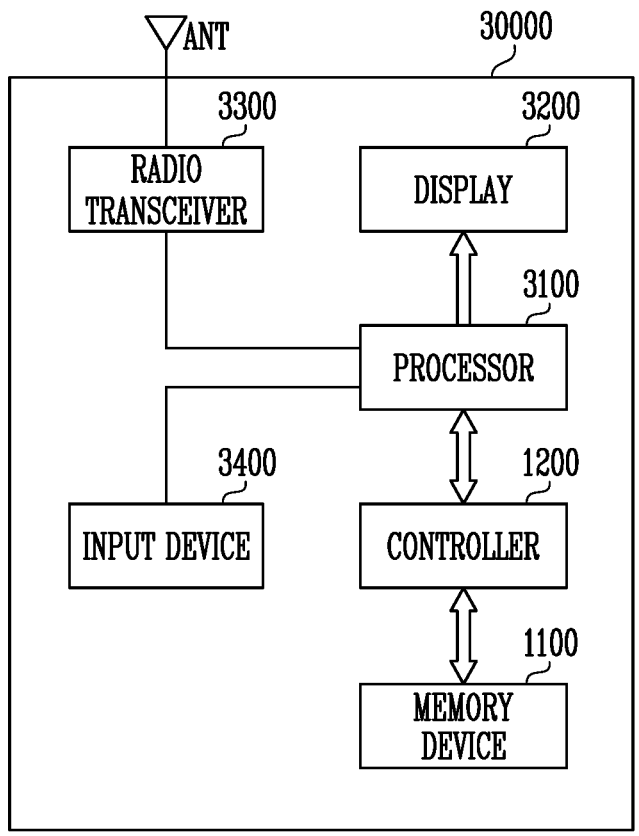
FIG. 13 is a diagram describing a memory system according to an embodiment of the present disclosure.

FIG. 13 is a diagram describing a memory system according to another embodiment.

Referring to FIG. 13, a memory system 30000 may be implemented as a cellular phone, a smart phone, a tablet PC, a personal digital assistant (PDA) or a wireless communication device. The memory system 30000 may include a memory device 1100 and a controller 1200 capable of controlling the operation of the memory device 1100. For example, the controller 1200 may control a data access operation, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program or write the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100. In addition, the memory device 1100 may include an interface circuit 400, such as that in the memory device 1100 shown in FIG. 1 or the memory device 1100 shown in FIG. 10.

Figure 14:
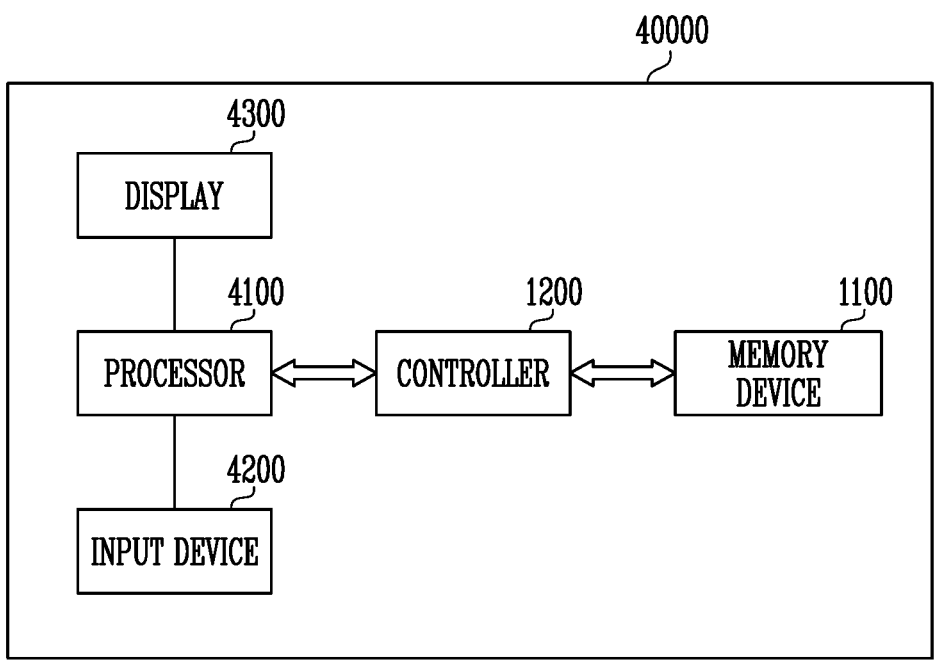
FIG. 14 is a diagram describing a memory system according to an embodiment of the present disclosure.

FIG. 14 is a diagram describing of a memory system according to an embodiment of the disclosure.

Referring to FIG. 14, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100. In addition, the memory device 1100 may include an interface circuit 400, such as that in the memory device 1100 shown in FIG. 1 or the memory device 1100 shown in FIG. 10.

Figure 15:
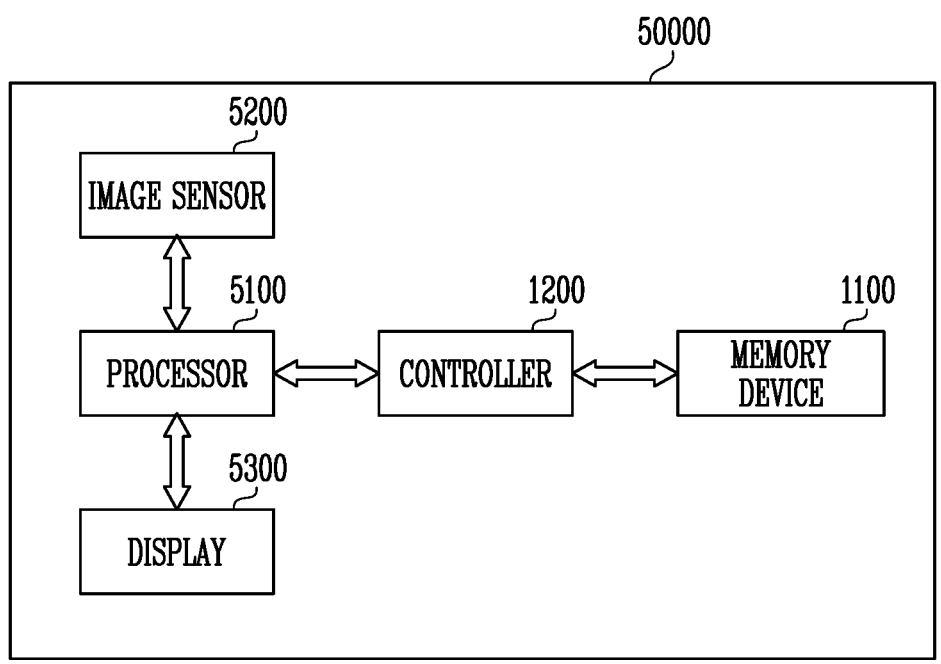
FIG. 15 is a diagram describing a memory system according to an embodiment of the present disclosure.

FIG. 15 is a diagram describing a memory system according to an embodiment of the invention.

Referring to FIG. 15, a memory system 50000 may be implemented as an image processing device, for example, a digital camera, a portable phone provided with a digital camera, a smart phone provided with a digital camera, or a tablet PC provided with a digital camera.

The memory system 50000 includes a memory device 1100 and a controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100. In addition, the memory device 1100 may include an interface circuit 400, such as that in the memory device 1100 shown in FIG. 1 or the memory device 1100 shown in FIG. 10.

Figure 16:
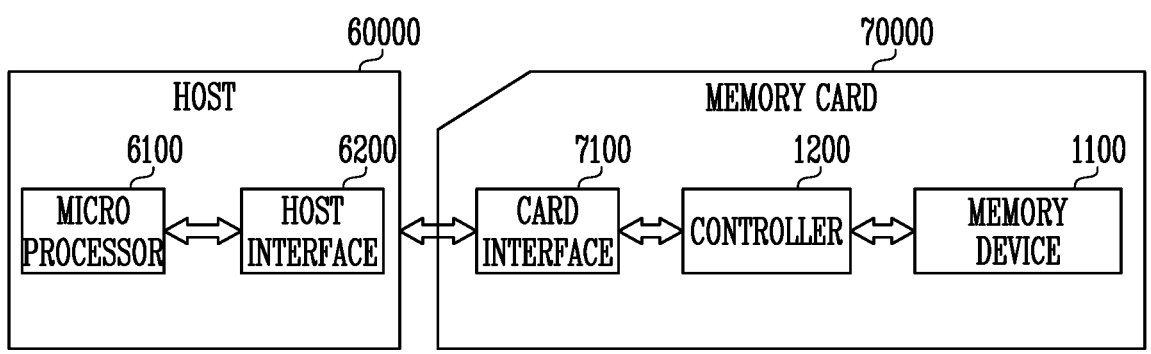
FIG. 16 is a diagram describing a memory system according to an embodiment of the present disclosure.

FIG. 16 is a diagram describing a memory system according to an embodiment of the disclosure.

Referring to FIG. 16, a memory system 70000 may be implemented as a memory card or a smart card. The memory system 70000 may include a memory device 1100, a controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory device 1100 may include an interface circuit 400, such as that in the memory device 1100 shown in FIG. 1 or the memory device 1100 shown in FIG. 10.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modifications and examples based on the technical spirit of the present disclosure are possible.

The present specification and drawings disclose a preferred embodiment of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A memory device in which an interface circuit and a semiconductor memory are packaged together, the memory device comprising:
    a centrally located region in a ball mapping region of a memory device in which data input/output pins for an operation of the interface circuit and the semiconductor memory are disposed; and
    a test pin region in which test pins for a test operation of the interface circuit are disposed,
    wherein the interface circuit mediates command and data communication between a controller outside of the memory device and the semiconductor memory.

2. The memory device of claim 1,
    wherein the ball mapping region of the memory device is bonded to an outer border of the memory device through a ball out process, and
    wherein the test pin region is disposed on opposite sides of the centrally located region.

3. The memory device of claim 1, wherein non-connecting pins are disposed in each of corner regions of the ball mapping region.

4. The memory device of claim 1, wherein the data input/output pins disposed in the centrally located region are bonded to an outer border through a ball out process.

5. The memory device of claim 4, wherein the test pins disposed in the test pin region are not bonded to the outer border.

6. A memory device in which an interface circuit and a semiconductor memory are packaged together, the memory device comprising:
    a center region of a ball mapping region of a memory device in which a plurality of data input/output pins for an operation that is not a test operation of the interface circuit and the semiconductor memory are disposed; and
    a first test pin region in which a plurality of first test pins for the test operation of the interface circuit are disposed, wherein a plurality of second test pins used during the test operation of the interface circuit are disposed in the center region, and wherein the interface circuit mediates command and data communication between a controller outside of the memory device and the semiconductor memory.

7. The memory device of claim 6, wherein the first test pin region is disposed on left and right sides, or upper and lower sides, of the center region.

8. The memory device of claim 6, further comprising:
a second test pin region in which a plurality of third test pins for the test operation of the semiconductor memory are disposed.

9. The memory device of claim 6, wherein a plurality of non-connecting pins are disposed in each of four corner regions of the ball mapping region.

10. The memory device of claim 9, wherein a plurality of fourth test pins used during the test operation of the interface circuit are disposed in each of the four corner regions of the ball mapping region.

11. The memory device of claim 10, wherein the plurality of fourth test pins are disposed in a region adjacent to the center region and adjacent to any of the four corner regions of the ball mapping regions.

12. The memory device of claim 6, wherein the test operation is a multi-channel test operation of the interface circuit.

13. The memory device of claim 8, wherein the plurality of data input/output pins disposed in the center region are bonded to an outer border of the memory device through a ball out process.

14. The memory device of claim 13, wherein the plurality of first test pins disposed in the first test pin region and the plurality of third test pins disposed in the second test pin region are not bonded to the outer border.

15. A test operation method of a memory device, the test operation method comprising:
providing a memory device including an interface circuit and a semiconductor memory connected to the interface circuit;
receiving a test command corresponding to a test operation of the interface circuit to be performed by the interface circuit;
performing a blocking operation to block signal transmission to the semiconductor memory from the interface circuit; and
performing the test operation of the interface circuit in response to the test command,
wherein the interface circuit mediates command and data communication between a controller outside of the memory device and the semiconductor memory.

16. The test operation method of claim 15, wherein the test command includes an address corresponding to the interface circuit.

17. The test operation method of claim 15, wherein the interface circuit receives signals through a plurality of test pins during the test operation and outputs signals generated according to a result of the test operation through the plurality test pins to an outside.

* * * * *